(12) United States Patent
Em

(10) Patent No.: US 10,964,376 B2
(45) Date of Patent: Mar. 30, 2021

(54) NONVOLATILE MEMORY APPARATUS, WRITE METHOD OF THE NONVOLATILE MEMORY APPARATUS, AND SYSTEM USING THE NONVOLATILE MEMORY APPARATUS

(71) Applicant: SK hynix Inc., Icheon-si (KR)

(72) Inventor: Ho Seok Em, Hwaseong-si (KR)

(73) Assignee: SK hynix Inc., Incheon-si (KR)

( * ) Notice: Subject to any disclaimer, the term of this patent is extended or adjusted under 35 U.S.C. 154(b) by 0 days.

(21) Appl. No.: 16/698,578

(22) Filed: Nov. 27, 2019

(65) Prior Publication Data

US 2020/0321043 A1    Oct. 8, 2020

(30) Foreign Application Priority Data

Apr. 4, 2019 (KR) .................. 10-2019-0039384

(51) Int. Cl.
| | | |
|---|---|---|
| G11C 11/4074 | (2006.01) | |
| G11C 11/409 | (2006.01) | |
| G11C 29/50 | (2006.01) | |
| G11C 11/56 | (2006.01) | |

(52) U.S. Cl.
CPC ........ *G11C 11/4074* (2013.01); *G11C 11/409* (2013.01); *G11C 11/5642* (2013.01); *G11C 29/50004* (2013.01); *G11C 2029/5004* (2013.01)

(58) Field of Classification Search
CPC ....... G11C 16/10; G11C 7/00; G11C 11/4074; G11C 11/409; G11C 29/50004; G11C 11/5642; G11C 2029/5004; G11C 29/021; G11C 29/028; G11C 13/0004; G11C 13/0097; G11C 2013/0076; G11C 2013/0054; G11C 13/004; G11C 13/0069
USPC ...................... 365/185.24, 189.011
See application file for complete search history.

(56) References Cited

U.S. PATENT DOCUMENTS

| | | | |
|---|---|---|---|
| 2005/0157548 A1* | 7/2005 | Nakajima | G11C 11/412 365/185.01 |
| 2007/0019467 A1* | 1/2007 | Toda | G11C 16/0483 365/185.2 |
| 2013/0077408 A1* | 3/2013 | Ueno | G11C 16/3454 365/185.22 |
| 2013/0182510 A1* | 7/2013 | Tanzawa | G11C 16/3459 365/185.24 |
| 2016/0232053 A1* | 8/2016 | Lin | G06F 11/108 |
| 2017/0011799 A1* | 1/2017 | Lee | G11C 16/24 |
| 2017/0236580 A1 | 8/2017 | Chu et al. | |
| 2018/0143762 A1* | 5/2018 | Kim | G06F 3/0652 |
| 2018/0151204 A1* | 5/2018 | Hong | G11C 11/5642 |
| 2018/0268908 A1* | 9/2018 | Iwasaki | G11C 16/0483 |
| 2019/0096493 A1* | 3/2019 | Gim | G11C 11/5635 |

(Continued)

*Primary Examiner* — Michael T Tran
(74) *Attorney, Agent, or Firm* — William Park & Associates Ltd.

(57) ABSTRACT

An operating method of a nonvolatile memory apparatus includes determining a first threshold voltage of a memory cell by using a first read voltage. The method includes determining a second threshold voltage of the memory cell by using a second read voltage having a different voltage level from the first read voltage based on write data and the first threshold voltage of the memory cell. The method includes writing the write data into the memory cell based on the first and second threshold voltages of the memory cell.

22 Claims, 6 Drawing Sheets

(56) References Cited

U.S. PATENT DOCUMENTS

| | | | | |
|---|---|---|---|---|
| 2019/0108092 A1* | 4/2019 | Lee | ............... | G06F 11/1012 |
| 2019/0164601 A1* | 5/2019 | Na | ............... | G11C 13/0004 |
| 2019/0267082 A1* | 8/2019 | Parkinson | ............... | G11C 13/0009 |
| 2019/0267099 A1* | 8/2019 | Yoo | ............... | G11C 16/349 |
| 2019/0279711 A1* | 9/2019 | Shimizu | ............... | G11C 13/0064 |
| 2019/0279724 A1* | 9/2019 | Itoh | ............... | G11C 11/5671 |
| 2019/0287615 A1* | 9/2019 | Iizuka | ............... | G11C 13/0069 |
| 2019/0294495 A1* | 9/2019 | Takagiwa | ............... | G11C 7/1063 |
| 2020/0050383 A1* | 2/2020 | Shen | ............... | G11C 13/004 |
| 2020/0050399 A1* | 2/2020 | Yeh | ............... | G11C 16/0483 |
| 2020/0066354 A1* | 2/2020 | Ioannou | ............... | G11C 16/0483 |
| 2020/0066361 A1* | 2/2020 | Ioannou | ............... | G11C 16/26 |
| 2020/0073451 A1* | 3/2020 | Nowell | ............... | G06F 1/3296 |
| 2020/0118620 A1* | 4/2020 | Bazarsky | ............... | G11C 11/5642 |
| 2020/0133528 A1* | 4/2020 | Sheperek | ............... | G06F 3/0655 |
| 2020/0192735 A1* | 6/2020 | Ioannou | ............... | G11C 16/26 |
| 2020/0194084 A1* | 6/2020 | Russo | ............... | G11C 16/0483 |
| 2020/0202926 A1* | 6/2020 | Chiang | ............... | G11C 16/0483 |

\* cited by examiner

NONVOLATILE MEMORY APPARATUS, WRITE METHOD OF THE NONVOLATILE MEMORY APPARATUS, AND SYSTEM USING THE NONVOLATILE MEMORY APPARATUS

CROSS-REFERENCES TO RELATED APPLICATION

The present application claims priority under 35 U.S.C. § 119(a) to Korean application number 10-2019-0039384, filed on Apr. 4, 2019, in the Korean Intellectual Property Office, which is incorporated herein by reference in its entirety as set forth in full.

BACKGROUND

1. Technical Field

Various embodiments of the present disclosure generally relate to an integrated circuit technology and, more particularly, to a nonvolatile memory apparatus and a system using the nonvolatile memory apparatus.

2. Related Art

An electronic device includes a lot of electronic elements, and a computer system includes lots of electronic elements each comprising a semiconductor. The computer system may include a memory apparatus. A dynamic random access memory (DRAM) is widely used as a general memory apparatus because of its advantage that it stores and outputs data at a fast and steady speed and is of random access. However, the DRAM has a volatile characteristic that it loses stored data when powered off since it has a memory cell comprising a capacitor. A flash memory apparatus is disclosed for overcoming such disadvantage of the DRAM. The flash memory apparatus has a nonvolatile characteristic that it keeps stored data even when powered off since it has a memory cell comprising a floating gate. However, the flash memory apparatus has disadvantage that it stores and outputs data at a slow speed and is not of random access, when compared with the DRAM.

Recently disclosed are next-generation memory apparatuses such as a phase change RAM, a magnetic RAM, a resistive RAM and a ferroelectric RAM that have advantages of fast operational speed and nonvolatile characteristics. Particularly, the PRAM has a phase change memory cell made from a chalcogenide and is capable of storing data by changing a resistive value of the memory cell.

SUMMARY

In an embodiment, an operating method of a nonvolatile memory apparatus. The method includes firstly determining a threshold voltage of a memory cell by using a first read voltage. The method may include secondly determining the threshold voltage of the memory cell by using a second read voltage having a different voltage level from the first read voltage based on write data and a result of the firstly determining. The method may include writing the write data into the memory cell based on the result of the firstly determining and a result of the secondly determining.

In an embodiment, a nonvolatile memory apparatus may include a memory cell array, a read circuit, a write circuit, a read control circuit, and a write control circuit. The memory cell array may include a plurality of memory cells. The read circuit may be configured to detect, based on a read pulse signal and a read voltage, a threshold voltage of a selected memory cell among the plurality of memory cells. The write circuit may be configured to perform, based on a reset write pulse signal a set write pulse signal, a write operation on the selected memory cell among the plurality of memory cells. The read control circuit may be configured to generate the read pulse signal based on a write signal and a read control signal and configured to provide, as the read voltage, one among a first reference voltage, a second reference voltage and a third reference voltage based on the read pulse signal and the write data. The write control circuit may be configured to generate the read control signal, the reset write pulse signal and the set write pulse signal based on the threshold voltage of the selected memory cell, the write signal and the write data.

DETAILED DESCRIPTION

Hereinafter, a semiconductor apparatus according to the present disclosure will be described below with reference to the accompanying drawings through various embodiments.

Figure 1:
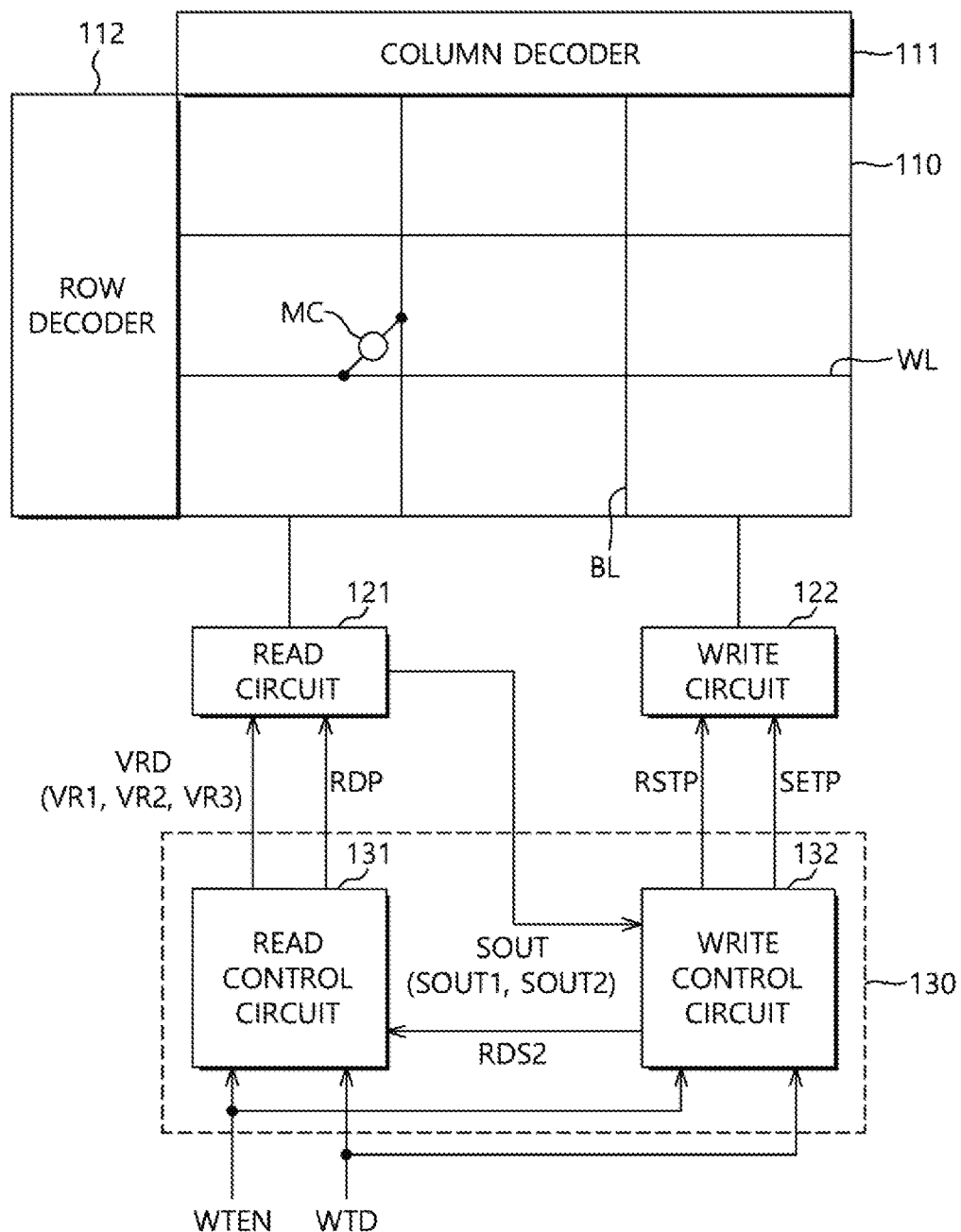
FIG. 1 is a diagram illustrating a configuration of a nonvolatile memory apparatus in accordance with an embodiment.

FIG. 1 is a diagram illustrating a configuration of a nonvolatile memory apparatus 100 in accordance with an embodiment. Referring to FIG. 1, the nonvolatile memory apparatus 100 may include a memory cell array 110. A plurality of bit lines BL may be disposed in a column direction within the memory cell array 110 and a plurality of word lines WL may be disposed in a row direction within the memory cell array 110. A plurality of memory cells MC may be respectively coupled to cross points between the plurality of bit lines BL and the plurality of word lines WL. Each of the memory cells MC may be electrically coupled between a corresponding bit line BL and a corresponding word line WL. The memory cell MC may be configured by a resistance change element, and, for example, may include a phase change material. The nonvolatile memory apparatus 100 may be a resistive memory apparatus or a phase change memory apparatus. The memory cell array 110 may be configured in a form of a cross-point array.

The nonvolatile memory apparatus 100 may include a column decoder 111, a row decoder 112, a read circuit 121 and a write circuit 122. The column decoder 111 may select a particular one among the plurality of bit lines BL based on a column address signal. The row decoder 112 may select a particular one among the plurality of word lines WL based on a row selection signal. When particular bit line and word line are selected, a particular memory cell electrically coupled to the selected bit line and word line may be selected. The selected memory cell may be electrically coupled to the read circuit 121 and the write circuit 122 through the selected bit line and/or the selected word line.

The read circuit 121 may perform a read operation for the selected memory cell MC. The read circuit 121 may determine a threshold voltage and/or a resistance status of the selected memory cell MC. The read circuit 121 may determine a threshold voltage and/or a resistance status of the selected memory cell MC based on a read pulse signal RDP and a read voltage VRD. The read circuit 121 may generate, when the read pulse signal RDP is enabled, a detection signal SOUT by comparing the threshold voltage of the selected memory cell MC and the voltage level of the read voltage VRD. For example, the read circuit 121 may generate, when the threshold voltage of the selected memory cell MC is higher than the voltage level of the read voltage VRD, the detection signal SOUT having a logic high level. For example, the read circuit 121 may generate, when the threshold voltage of the selected memory cell MC is lower than the voltage level of the read voltage VRD, the detection signal SOUT having a logic low level.

The write circuit 122 may perform a write operation for the selected memory cell MC. The write circuit 122 may write reset data or set data into the selected memory cell MC. The write circuit 122 may perform a write operation for the selected memory cell MC based on a reset write pulse signal RSTP and a set write pulse signal SETP. The write circuit 122 may write reset data into the selected memory cell MC by applying a reset program current to the selected memory cell MC based on the reset write pulse signal RSTP. The write circuit 122 may write set data into the selected memory cell MC by applying a set program current to the selected memory cell MC based on the set write pulse signal SETP. The reset program current may be a greater amount than the set program current.

The nonvolatile memory apparatus 100 may further include a write operation control circuit 130. The write operation control circuit 130 may control the read circuit 121 and the write circuit 122 in order to write reset data or set data into the selected memory cell MC. Based on a write signal WTEN and write data WTD, the write operation control circuit 130 may provide the read circuit 121 with the read pulse signal RDP and the read voltage VRD and may provide the write circuit 122 with at least one between the reset write pulse signal RSTP and the set write pulse signal SETP. The write signal WTEN may be enabled when a write operation of the nonvolatile memory apparatus 100 is performed. The write data WTD may be data to be stored in a memory cell MC selected through the write operation. For example, the write data WTD may include reset data and set data. When a write operation of the nonvolatile memory apparatus 100 is performed, the write operation control circuit 130 may control the read circuit 121 to firstly determine the threshold voltage of the selected memory cell MC. Based on a result of the first determination of the threshold voltage and the write data WTD, the write operation control circuit 130 may control the read circuit 121 to secondly determine the threshold voltage of the selected memory cell MC or may control the write circuit 122 to write the write data WTD into the selected memory cell MC. Also, based on the results of the first and second determination of the threshold voltage, the write operation control circuit 130 may terminate the write operation of the nonvolatile memory apparatus 100 without writing the write data WTD into the selected memory cell MC.

The write operation control circuit 130 may include a read control circuit 131 and a write control circuit 132. The read control circuit 131 may generate the read pulse signal RDP and the read voltage VRD based on the write signal WTEN and the write data WTD. The read pulse signal RDP may include a first read pulse signal RDP1 and a second read pulse signal RDP2. The read control circuit 131 may generate the first read pulse signal RDP1 based on the write signal WTEN and may provide a first reference voltage VR1 as the read voltage VRD. The first read pulse signal RDP1 may be the read pulse signal RDP for the first determination of the threshold voltage of the selected memory cell MC. The read voltage VRD to be used for the first determination of the threshold voltage of the selected memory cell MC may be a first read voltage. The read control circuit 131 may generate the second read pulse signal RDP2 based on a read control signal RDS2 and may provide one between a second reference voltage VR2 and a third reference voltage VR3 as the read voltage VRD based on the write data WTD. The second read pulse signal RDP2 may be the read pulse signal RDP for the second determination of the threshold voltage of the selected memory cell MC. The read voltage VRD to be used for the second determination of the threshold voltage of the selected memory cell MC may be a second read voltage. The read control circuit 131 may provide the second reference voltage VR2 as the read voltage VRD when the write data WTD is reset data. The read control circuit 131 may provide the third reference voltage VR3 as the read voltage VRD when the write data WTD is set data. The first reference voltage VR1, second reference voltage VR2 and third reference voltage VR3 may be generated from a voltage generator included in the nonvolatile memory apparatus 100. The second reference voltage VR2 may have a higher voltage level than the first reference voltage VR1. The third reference voltage VR3 may have a lower voltage level than the first reference voltage VR1.

Figure 2:
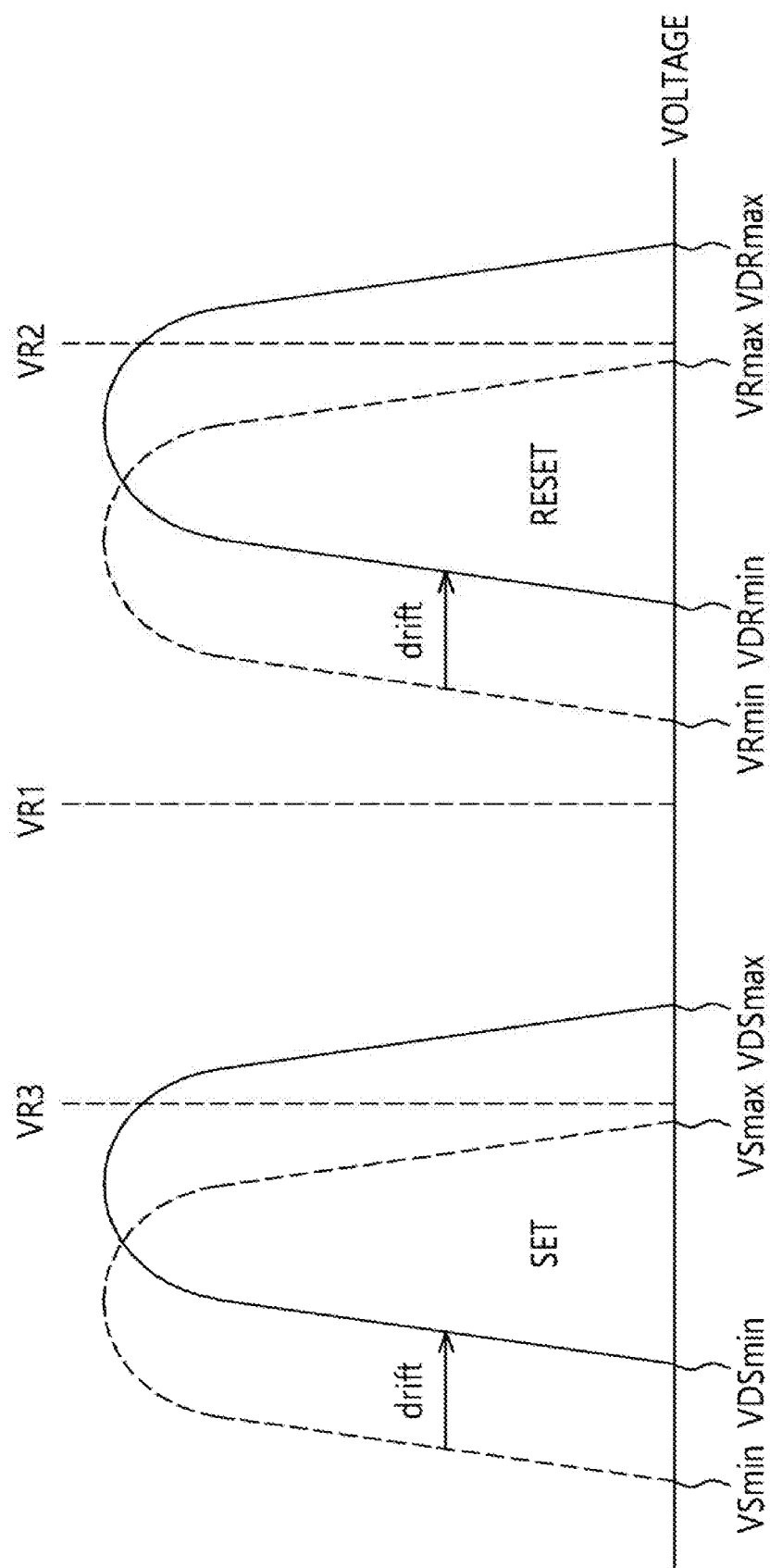
FIG. 2 is a graph illustrating a threshold voltage distribution according to resistance statuses of memory cells.

FIG. 2 is a graph illustrating a threshold voltage distribution according to resistance statuses of memory cells. A memory cell RESET into which reset data is written may be in a high resistance status and may have a relatively high threshold voltage. A memory cell SET into which set data is written may be in a low resistance status and may have a relatively low threshold voltage. Broken lines in FIG. 2 represent normal threshold voltage distributions of memory cells into which set data and reset data are written. Solid lines in FIG. 2 represent threshold voltage distributions distorted from the normal threshold voltage distributions due to resistance drift. A memory cell SET into which set data is written may have a threshold voltage generally between a set distribution minimum voltage VSmin and a set distribution maximum voltage VSmax. A memory cell RESET into which reset data is written may have a threshold voltage generally between a reset distribution minimum voltage VRmin and a reset distribution maximum voltage VRmax. A memory cell MC of the nonvolatile memory apparatus 100 may be vulnerable to resistance drift. The resistance drift may be a phenomenon that a resistance value of the memory cell MC increases with the course of time. Due to the resistance drift, the threshold voltage of the memory cell SET into which set data is written and the threshold voltage of the memory cell RESET into which reset data is written may increase.

When the resistance drift occurs, the memory cell SET into which set data is written may have a threshold voltage between a drift set distribution minimum voltage VDSmin and a drift set distribution maximum voltage VDSmax. Therefore, the memory cell SET into which set data is written may have a threshold voltage actually between the set distribution minimum voltage VSmin and the drift set distribution maximum voltage VDSmax. When the resistance drift occurs, the memory cell RESET into which reset data is written may have a threshold voltage between a drift reset distribution minimum voltage VDRmin and a drift reset distribution maximum voltage VDRmax. Therefore, the memory cell RESET into which reset data is written may have a threshold voltage actually between the reset distribution minimum voltage VRmin and the drift reset distribution maximum voltage VDRmax.

The first reference voltage VR1 may have a voltage level between the drift set distribution maximum voltage VDSmax and the drift reset distribution minimum voltage VDRmin to discriminate between the threshold voltage of the memory cell SET into which set data is written and the threshold voltage of the memory cell SET into which set data is written. For example, the first reference voltage VR1 may be set to have a voltage level corresponding to a middle between the drift set distribution maximum voltage VDSmax and the drift reset distribution minimum voltage VDRmin. The second reference voltage VR2 may have a voltage level lower than the drift reset distribution maximum voltage VDRmax and higher than a middle voltage of the drift reset distribution. The middle voltage of the drift reset distribution may have a voltage level corresponding to a middle between the drift reset distribution minimum voltage VDRmin and the drift reset distribution maximum voltage VDRmax. The third reference voltage VR3 may have a voltage level lower than the drift set distribution maximum voltage VDSmax and higher than a middle voltage of the drift set distribution. The middle voltage of the drift set distribution may have a voltage level corresponding to a middle between the drift set distribution minimum voltage VDSmin and the drift set distribution maximum voltage VDSmax.

Referring back to FIG. 1, the write control circuit 132 may receive the threshold voltage of the selected memory cell MC, the write signal WTEN and the write data WTD. The write control circuit 132 may generate the reset write pulse signal RSTP and the set write pulse signal SETP based on the threshold voltage of the selected memory cell MC, the write signal WTEN and the write data WTD. The write control circuit 132 may obtain information regarding the threshold voltage of the selected memory cell MC based on the detection signal SOUT output from the read circuit 121. The write control circuit 132 may generate the read control signal RDS2 based on the threshold voltage of the selected memory cell MC, the write data WTD, and a first detection signal SOUT1. The write control circuit 132 may generate one between the reset write pulse signal RSTP and the set write pulse signal SETP based on the first detection signal SOUT1 and the write data WTD. The write control circuit 132 may generate one between the reset write pulse signal RSTP and the set write pulse signal SETP based on the first detection signal SOUT1, a second detection signal SOUT2 and the write data WTD. The first detection signal SOUT1 may be the detection signal SOUT generated when the read circuit 121 firstly determines the threshold voltage of the selected memory cell MC based on the first read pulse signal RDP1. The second detection signal SOUT2 may be the detection signal SOUT generated when the read circuit 121 secondly determines the threshold voltage of the selected memory cell MC based on the second read pulse signal RDP2.

Figure 3:
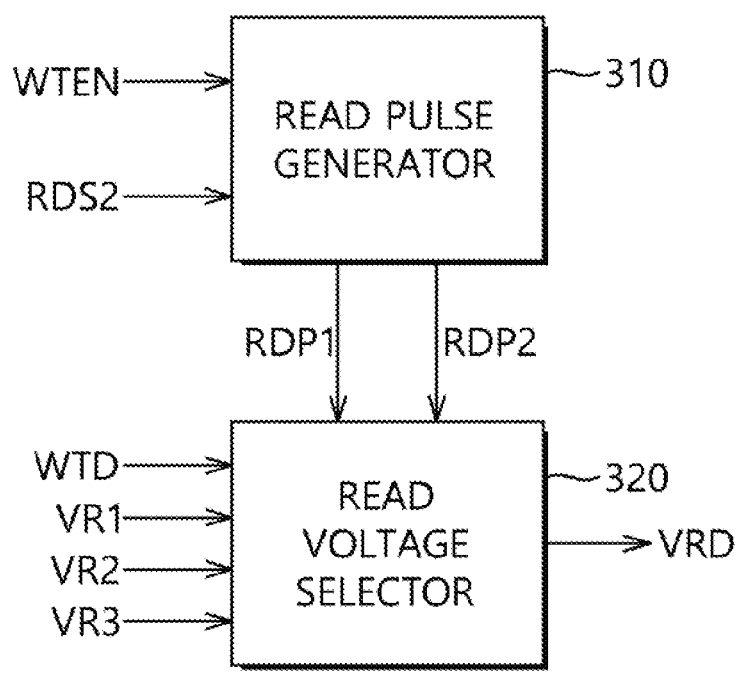
FIG. 3 is a diagram illustrating a configuration of a read control circuit illustrated in FIG. 1.

FIG. 3 is a diagram illustrating a configuration of the read control circuit 131 illustrated in FIG. 1. Referring to FIG. 3, the read control circuit 131 may include a read pulse generator 310 and a read voltage selector 320. The read pulse generator 310 may receive the write signal WTEN and the read control signal RDS2 and may output the first read pulse signal RDP1 and the second read pulse signal RDP2. The read pulse generator 310 may generate the first read pulse signal RDP1 based on the write signal WTEN. The read pulse generator 310 may generate the first read pulse signal RDP1 when the write signal WTEN is enabled. The read pulse generator 310 may generate the second read pulse signal RDP2 based on the read control signal RDS2. The read pulse generator 310 may generate the second read pulse signal RDP2 when the read control signal RDS2 is enabled. The read pulse generator 310 may prevent generation of the second read pulse signal RDP2 when the read control signal RDS2 is kept as disabled without becoming enabled. That is, the read pulse generator 310 might not generate the second read pulse signal RDP2.

The read voltage selector 320 may receive the write data WTD, the first reference voltage VR1, the second reference voltage VR2 and the third reference voltage VR3. The read voltage selector 320 may receive the first read pulse signal RDP1 and the second read pulse signal RDP2 from the read pulse generator 310. The read voltage selector 320 may output the first reference voltage VR1 as the read voltage VRD based on the first read pulse signal RDP1. The read voltage selector 320 may output the first reference voltage VR1 as the read voltage VRD when the first read pulse signal RDP1 is enable, thereby causing the threshold voltage of the selected memory cell MC to be compared with the first reference voltage VR1. The read voltage selector 320 may be output, as the read voltage VRD, one between the second reference voltage VR2 and the third reference voltage VR3 based on the second read pulse signal RDP2 and the write data WTD. The read voltage selector 320 may output the second reference voltage VR2 as the read voltage VRD when the second read pulse signal RDP2 is enabled and the write data WTD is reset data. Therefore, the threshold voltage of the selected memory cell MC may be compared with the second reference voltage VR2. The read voltage selector 320 may output the third reference voltage VR3 as the read voltage VRD when the second read pulse signal RDP2 is enabled and the write data WTD is set data. Therefore, the threshold voltage of the selected memory cell MC may be compared with the third reference voltage VR3.

Figure 4:
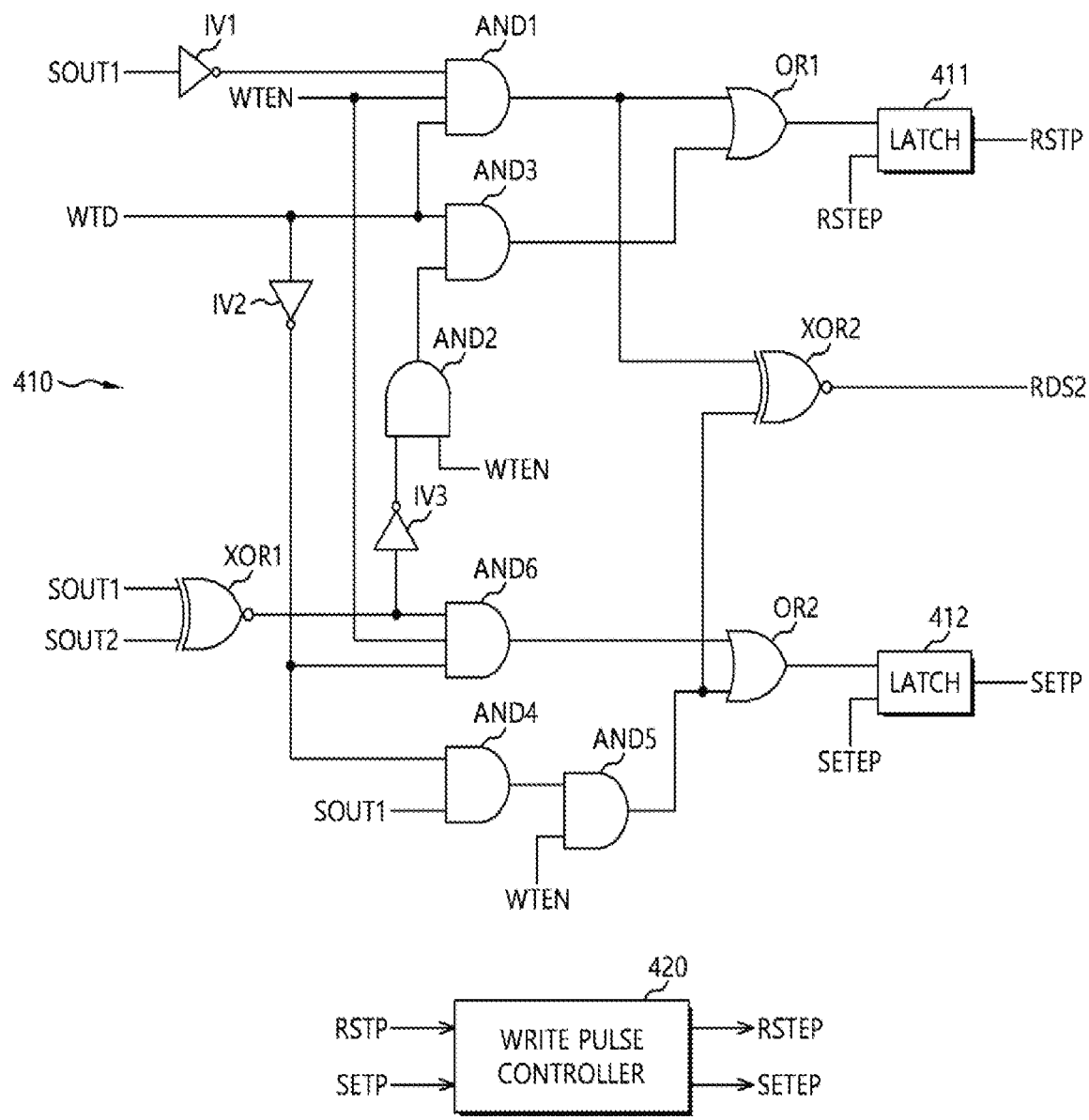
FIG. 4 is a diagram illustrating a configuration of a write control circuit illustrated in FIG. 1.

FIG. 4 is a diagram illustrating a configuration of the write control circuit 132 illustrated in FIG. 1. The write control circuit 132 may include a write signal generator 410. The write signal generator 410 may generate the reset write pulse signal RSTP and the set write pulse signal SETP based on the write signal WTEN, the write data WTD, the first detection signal SOUT1 and the second detection signal SOUT2. The write signal generator 410 may generate the reset write pulse signal RSTP based on at least one between the first detection signal SOUT1 and the second detection signal SOUT2 when the write signal WTEN is enabled and the write data WTD is reset data. The write signal generator 410 may generate the set write pulse signal SETP based on at least one between the first detection signal SOUT1 and the second detection signal SOUT2 when the write signal WTEN is enabled and the write data WTD is set data. The write signal generator 410 may generate the read control signal RDS2 based on the first detection signal SOUT1 and the write data WTD.

The write signal generator 410 may include a first inverter IV1, a second inverter IV2, a third inverter IV3, a first AND gate AND1, a second AND gate AND2, a third AND gate AND3, a fourth AND gate AND4, a fifth AND gate AND5, a sixth AND gate AND6, a seventh AND gate AND7, a first exclusive OR gate XOR1, a second exclusive OR gate XOR2, a first OR gate OR1, a second OR gate OR2, a first latch 411 an a second latch 412. The first inverter IV1 may invert the first detection signal SOUT1 and may output the inverted signal. The second inverter IV2 may receive the write data WTD, may invert the write data WTD and may output the inverted signal. The first AND gate AND1 may receive the output of the first inverter IV1, the write signal WTEN and the write data WTD. The first exclusive OR gate XOR1 may receive the first detection signal SOUT1 and the second detection signal SOUT2. The third inverter IV3 may invert the output of the first exclusive OR gate XOR1 and may output the inverted signal. The second AND gate AND2 may receive the output of the third inverter IV3 and the write signal WTEN. The third AND gate AND3 may receive the write data WTD and the output of the second AND gate AND2. The first OR gate OR1 may receive the output of the first AND gate AND1 and the output of the third AND gate AND3. The first latch 411 may receive the output of the first OR gate OR1 and may generate the reset write pulse signal RSTP. The first latch 411 may further receive a reset pulse control signal RSTEP. The first latch 411 may enable the reset write pulse signal RSTP based on the output of the first OR gate OR1 and may disable the reset write pulse signal RSTP based on the reset pulse control signal RSTEP. The fourth AND gate AND4 may receive the output of the second inverter IV2 and the first detection signal SOUT1. The fifth AND gate AND5 may receive the output of the fourth AND gate AND4 and the write signal WTEN. The sixth AND gate AND6 may receive the output of the first exclusive OR gate XOR1, the write signal WTEN and the output of the second inverter IV2. The second OR gate OR2 may receive the output of the fifth AND gate AND5 and the output of the sixth AND gate AND6. The second latch 412 may receive the output of the second OR gate OR2 and may generate the set write pulse signal SETP. The second latch 412 may receive a set pulse control signal SETEP. The second latch 412 may enable the set write pulse signal SETP based on the output of the second OR gate OR2 and may disable the set write pulse signal SETP based on the set pulse control signal SETEP. The second exclusive OR gate XOR2 may receive the output of the first AND gate AND1 and the output of the fifth AND gate AND5 and may output the read control signal RDS2.

The write control circuit 132 may further include a write pulse controller 420. The write pulse controller 420 may generate the reset pulse control signal RSTEP and the set pulse control signal SETEP. The write pulse controller 420 may generate the reset pulse control signal RSTEP and the set pulse control signal SETEP in order to adjust pulse widths of the reset write pulse signal RSTP and the set write pulse signal SETP. The set write pulse signal SETP may have a wider pulse width than the reset write pulse signal RSTP and may be enabled for longer time than the reset write pulse signal RSTP. In order to adjust the pulse width of the reset write pulse signal RSTP, the write pulse controller 420 may generate, when the reset write pulse signal RSTP is enabled, the reset pulse control signal RSTEP by counting a clock signal. In order to adjust the pulse width of the set write pulse signal SETP, the write pulse controller 420 may generate, when the set write pulse signal SETP is enabled, the set pulse control signal SETEP by counting a clock signal.

TABLE 1

| WTD | SOUT1 | RDS2 | SOUT2 | |
|---|---|---|---|---|
| Reset | H | Enable | L | No Write |
| Reset | H | Enable | H | RSTP |
| Reset | L | — | — | RSTP |
| Set | H | — | — | SETP |
| Set | L | Enable | L | No Write |
| Set | L | Enable | H | SETP |

Table 1 above may show the operations of the write control circuit 132 and the write signal generator 410. When a write operation of the nonvolatile memory apparatus 100 is performed, the write signal WTEN may be enabled to a logic high level. The write data WTD may have a logic high level when the write data WTD is reset data Reset and may have a logic low level when the write data WTD is set data Set. The first detection signal SOUT1 and the second detection signal SOUT2 may have a logic high level when the threshold voltage of the selected memory cell MC has a higher voltage level than the read voltage VRD and may have a logic low level when the threshold voltage of the selected memory cell MC has a lower voltage level than the read voltage VRD. When the write data WTD is reset data Reset and the first detection signal SOUT1 has a logic high level, the read control signal RDS2 may be enabled. When the second detection signal SOUT2 has a logic low level, the write signal generator 410 might not enable both of the reset write pulse signal RSTP and the set write pulse signal SETP. The write circuit 122 might not perform an operation of writing the reset data Reset into the selected memory cell MC. When the second detection signal SOUT2 has a logic high level, the write signal generator 410 may enable the reset write pulse signal RSTP. The write circuit 122 may write the reset data Reset into the selected memory cell MC based on the reset write pulse signal RSTP. When the first detection signal SOUT1 has a logic low level, the write signal generator 410 might not enable the read control signal RDS2 and may enable the reset write pulse signal RSTP. Therefore, the second detection signal SOUT2 might not be generated and the write circuit 122 may write the reset data Reset into the selected memory cell MC based on the reset write pulse signal RSTP.

When the write data WTD is set data Set and the first detection signal SOUT1 has a logic high level, the write signal generator 410 might not enable the read control signal RDS2 and may enable the set write pulse signal SETP. Therefore, the second detection signal SOUT2 might not be generated, the write circuit 122 may write the set data Set into the selected memory cell MC based on the set write pulse signal SETP. When the first detection signal SOUT1 has a logic low level, the write signal generator 410 may enable the read control signal RDS2. When the second detection signal SOUT2 has a logic low level, the write signal generator 410 might not enable both of the reset write pulse signal RSTP and the set write pulse signal SETP. The write circuit 122 might not perform an operation of writing the set data Set into the selected memory cell MC. When the second detection signal SOUT2 has a logic high level, the write signal generator 410 may enable the set write pulse signal SETP. The write circuit 122 may write the set data Set into the selected memory cell MC based on the set write pulse signal SETP. Although FIG. 4 illustrates an embodiment of the write signal generator 410, FIG. 4 will not limit the configuration of the write signal generator 410. The write signal generator 410 may be changed and modified to any combination of other logic gate circuits as far as the write signal generator 410 performs the operations represented by Table 1.

Figure 5:
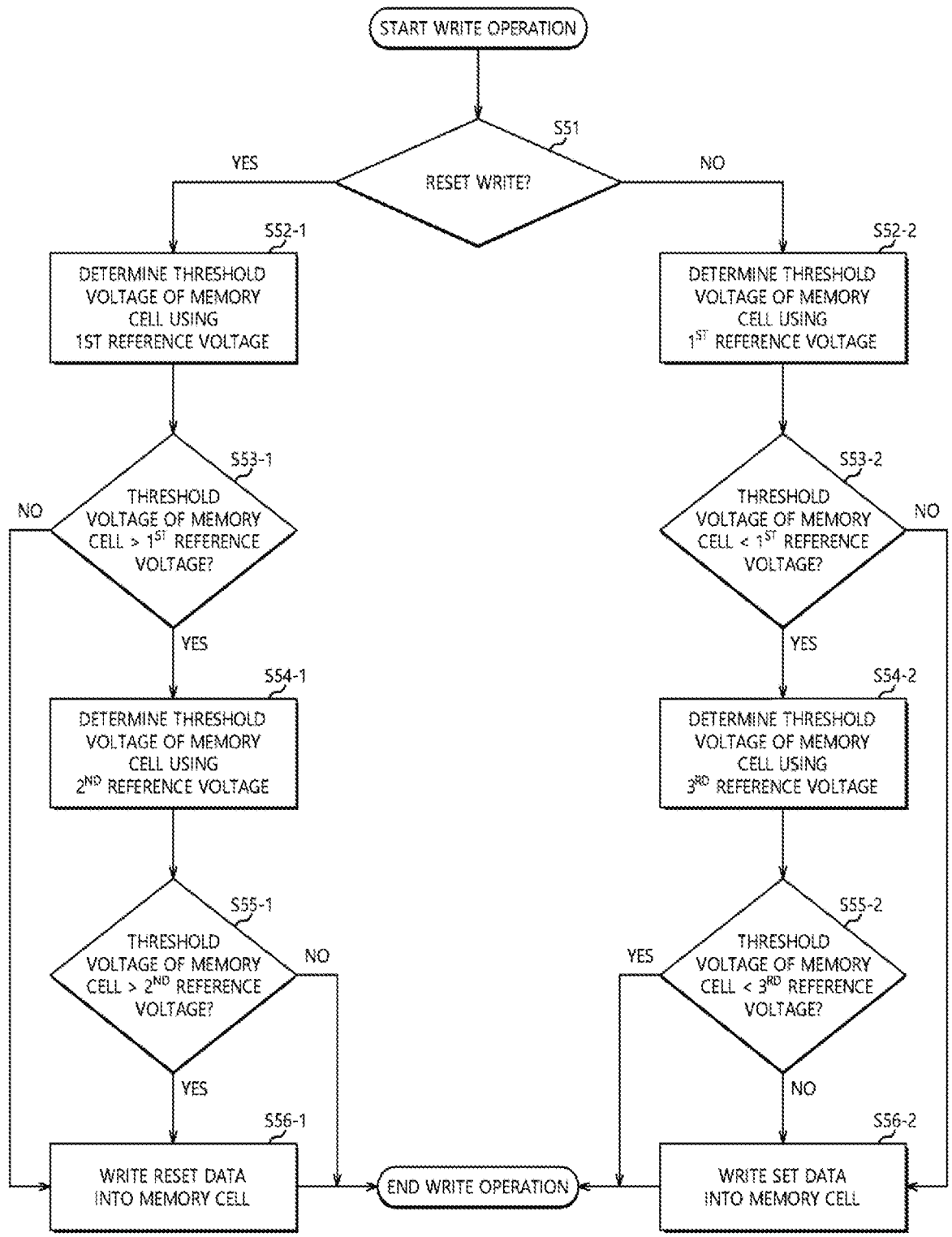
FIG. 5 is a flowchart illustrating an operation of a nonvolatile memory apparatus in accordance with an embodiment.

FIG. 5 is a flowchart illustrating an operation of a nonvolatile memory apparatus in accordance with an embodiment. Hereinafter, described with reference to FIGS. 1 to 5 will be the operation of the nonvolatile memory apparatus 100 in accordance with an embodiment. When a write operation of the nonvolatile memory apparatus 100 is performed, the write signal WTEN may be enabled. In step S51, it may be determined whether the write data WTD is reset data. It may be determined on the basis of the write data WTD whether the write operation is a write operation for storing reset data or a write operation for storing set data. When the write data WTD is reset data ("YES" in step S51), the process may proceed to step S52-1. When the write data WTD is set data ("NO" in step S51), the process may proceed to step S52-2. Steps S52-1 and S52-2 may be processes of substantially the same operation as each other.

When the write data WTD is reset data, a threshold voltage of a selected memory cell MC may be determined by using the first reference voltage VR1 in step S52-1. Step S52-1 may be a step of firstly determining the threshold voltage of the selected memory cell MC. In step S53-1, it may be determined whether the threshold voltage of the selected memory cell MC is higher than the first reference voltage VR1. When the write signal WTEN is enabled, the read pulse generator 310 may enable the first read pulse signal RDP1. The read voltage selector 320 may output the first reference voltage VR1 as the read voltage VRD based on the first read pulse signal RDP1. The read circuit 121 may receive the read voltage VRD and may perform a read operation on the selected memory cell MC by using the read voltage VRD. That is, the read circuit 121 may detect the resistance status and/or the threshold voltage of the selected memory cell MC by using the read voltage VRD. The first detection signal SOUT1 having a logic high level may be generated when the threshold voltage of the selected memory cell MC has a higher voltage level than the first reference voltage VR1 and the first detection signal SOUT1 having a logic low level may be generated when the threshold voltage of the selected memory cell MC has a lower voltage level than the first reference voltage VR1.

When the threshold voltage of the selected memory cell MC is determined to have a higher voltage level than the first reference voltage VR1 in step S53-1 ("YES" in step S53-1), the process may proceed to step S54-1. In step S54-1, the threshold voltage of the selected memory cell MC may be determined by using the second reference voltage VR2. Step S54-1 may be a step of secondly determining the threshold voltage of the selected memory cell MC. In step S55-1, it may be determined whether the threshold voltage of the selected memory cell MC is higher than the second reference voltage VR2. When the first detection signal SOUT1 having a logic high level is generated, the write signal generator 410 may enable the read control signal RDS2. The read pulse generator 310 may enable the second read pulse signal RDP2 based on the read control signal RDS2. The read voltage selector 320 may output the second reference voltage VR2 as the read voltage VRD based on the second read pulse signal RDP2 and the write data WTD. The read circuit 121 may receive the read voltage VRD and may perform a read operation on the selected memory cell MC by using the read voltage VRD. That is, the read circuit 121 may detect the resistance status and/or the threshold voltage of the selected memory cell MC by using the read voltage VRD. The second detection signal SOUT2 having a logic high level may be generated when the threshold voltage of the selected memory cell MC has a higher voltage level than the second reference voltage VR2 and the second detection signal SOUT2 having a logic low level may be generated when the threshold voltage of the selected memory cell MC has a lower voltage level than the second reference voltage VR2.

When the threshold voltage of the selected memory cell MC is determined to have a higher voltage level than the second reference voltage VR2 in step S55-1 ("YES" in step S55-1), the process may proceed to step S56-1. In step S56-1, reset data may be written into the selected memory cell MC. When step S56-1 is completed, the write operation of the nonvolatile memory apparatus 100 may end. When the second detection signal SOUT2 having a logic high level is generated, the write signal generator 410 may enable the reset write pulse signal RSTP. Therefore, the write circuit 122 may write the reset data into the selected memory cell MC based on the reset write pulse signal RSTP. Referring to FIG. 2, when both of the first detection signal SOUT1 and the second detection signal SOUT2 have a logic high level, the threshold voltage of the selected memory cell MC may have a voltage level between the second reference voltage VR2 and the drift reset distribution maximum voltage VDRmax. It may be a high probability that the resistance status of the selected memory cell MC having a higher threshold voltage than the second reference voltage VR2 becomes an over reset status. When the selected memory cell MC is over-reset, there may occur a hard fail that the resistance status of the selected memory cell MC does not change even when the write operation is performed to the selected memory cell MC. Therefore, writing the reset data into the selected memory cell MC having a higher threshold voltage than the second reference voltage VR2 may allow the selected memory cell MC to have a threshold voltage of a normal high resistance status.

When the threshold voltage of the selected memory cell MC is determined to have a lower voltage level than the first reference voltage VR1 in step S53-1 ("NO" in step S53-1), the process may proceed to step S56-1 by bypassing steps S54-1 and S55-1. When the threshold voltage of the selected memory cell MC is determined to have a lower voltage level than the first reference voltage VR1, the resistance status of the selected memory cell MC may be determined as a low resistance status. Therefore, the reset data may be written into the selected memory cell MC without performing the step of secondly determining the threshold voltage of the selected memory cell MC. When the first detection signal SOUT1 has a logic low level, the write signal generator 410 might not enable the read control signal RDS2 and the read pulse generator 310 might not generate the second read pulse signal RDP2. When the first detection signal SOUT1 has a logic low level, the write signal generator 410 may enable the reset write pulse signal RSTP and the write circuit 122 may write the reset data into the selected memory cell MC based on the reset write pulse signal RSTP.

When the threshold voltage of the selected memory cell MC is determined to have a lower voltage level than the second reference voltage VR2 in step S55-1 ("NO" in step S55-1), the write operation of the nonvolatile memory apparatus 100 may end by bypassing step S56-1. When the threshold voltage of the selected memory cell MC is higher than the first reference voltage VR1 and lower than the second reference voltage VR2, the threshold voltage of the selected memory cell MC may have a voltage level between the reset distribution minimum voltage VRmin and the second reference voltage VR2. Since the resistance status of the selected memory cell MC having the threshold voltage between the reset distribution minimum voltage VRmin and the second reference voltage VR2 has a sufficient margin to be discriminated from the low resistance status, there may be no need to re-write the reset data into the selected memory cell MC. When the reset data is not written into the selected memory cell MC, power consumption for a write operation may be reduced. When the second detection signal SOUT2 has a logic low level, the write signal generator 410 might not enable the reset write pulse signal RSTP and the write circuit 122 might not write the reset data into the selected memory cell MC.

When the write data WTD is set data, the threshold voltage of the selected memory cell MC may be determined by using the first reference voltage VR1 in step S52-2. Step S52-2 may be a step of firstly determining the threshold voltage of the selected memory cell MC. In step S53-2, it may be determined whether the threshold voltage of the selected memory cell MC is lower than the first reference voltage VR1. When the write signal WTEN is enabled, the read pulse generator 310 may enable the first read pulse signal RDP1. The read voltage selector 320 may output the first reference voltage VR1 as the read voltage VRD based on the first read pulse signal RDP1. The read circuit 121 may receive the read voltage VRD and may perform a read operation on the selected memory cell MC by using the read voltage VRD. That is, the read circuit 121 may detect the resistance status and/or the threshold voltage of the selected memory cell MC by using the read voltage VRD. The first detection signal SOUT1 having a logic low level may be generated when the threshold voltage of the selected memory cell MC has a lower voltage level than the first reference voltage VR1 and the first detection signal SOUT1 having a logic high level may be generated when the threshold voltage of the selected memory cell MC has a higher voltage level than the first reference voltage VR1.

When the threshold voltage of the selected memory cell MC is determined to have a lower voltage level than the first reference voltage VR1 in step S53-2 ("YES" in step S53-2), the process may proceed to step S54-2. In step S54-2, the threshold voltage of the selected memory cell MC may be determined by using the third reference voltage VR3. Step S54-2 may be a step of secondly determining the threshold voltage of the selected memory cell MC. In step S55-2, it may be determined whether the threshold voltage of the selected memory cell MC is lower than the third reference voltage VR3. When the first detection signal SOUT1 having a logic low level is generated, the write signal generator 410 may enable the read control signal RDS2. The read pulse generator 310 may enable the second read pulse signal RDP2 based on the read control signal RDS2. The read voltage selector 320 may output the third reference voltage VR3 as the read voltage VRD based on the second read pulse signal RDP2 and the write data WTD. The read circuit 121 may receive the read voltage VRD and may perform a read operation on the selected memory cell MC by using the read voltage VRD. That is, the read circuit 121 may detect the resistance status and/or the threshold voltage of the selected memory cell MC by using the read voltage VRD. The second detection signal SOUT2 having a logic high level may be generated when the threshold voltage of the selected memory cell MC has a higher voltage level than the third reference voltage VR3 and the second detection signal SOUT2 having a logic low level may be generated when the threshold voltage of the selected memory cell MC has a lower voltage level than the third reference voltage VR3.

When the threshold voltage of the selected memory cell MC is determined to have a higher voltage level than the third reference voltage VR3 in step S55-2 ("NO" in step S55-2), the process may proceed to step S56-2. In step S56-2, set data may be written into the selected memory cell MC. When step S56-2 is completed, the write operation of the nonvolatile memory apparatus 100 may end. When the second detection signal SOUT2 having a logic high level is generated, the write signal generator 410 may enable the set write pulse signal SETP. Therefore, the write circuit 122 may write the set data into the selected memory cell MC based on the set write pulse signal SETP. Referring to FIG. 2, when the first detection signal SOUT1 has a logic low level and the second detection signal SOUT2 has a logic high level, the threshold voltage of the selected memory cell MC may have a voltage level between the third reference voltage VR3 and the drift set distribution maximum voltage VDSmax. The resistance status of the selected memory cell MC having a threshold voltage between the third reference voltage VR3 and the drift set distribution maximum voltage VDSmax might not have a sufficient margin to be discriminated from a normal high resistance status and may be vulnerable to the disturbance. Therefore, writing the set data into the selected memory cell MC having a threshold voltage between the third reference voltage VR3 and the drift set distribution maximum voltage VDSmax may allow the selected memory cell MC to have a threshold voltage of a normal low resistance status.

When the threshold voltage of the selected memory cell MC is determined to have a higher voltage level than the first reference voltage VR1 in step S53-2 ("NO" in step S53-2), the process may proceed to step S56-2 by bypassing steps S54-2 and S55-2. When the threshold voltage of the selected memory cell MC is determined to have a higher voltage level than the first reference voltage VR1, the resistance status of the selected memory cell MC may be determined as a high resistance status. Therefore, the set data may be written into the selected memory cell MC without performing the step of secondly determining the threshold voltage of the selected memory cell MC. When the first detection signal SOUT1 has a logic high level, the write signal generator 410 might not enable the read control signal RDS2 and the read pulse generator 310 might not generate the second read pulse signal RDP2. When the first detection signal SOUT1 has a logic high level, the write signal generator 410 may enable the set write pulse signal SETP and the write circuit 122 may write the set data into the selected memory cell MC based on the set write pulse signal SETP.

When the threshold voltage of the selected memory cell MC is determined to have a lower voltage level than the third reference voltage VR3 in step S55-2 ("YES" in step S55-2), the write operation of the nonvolatile memory apparatus 100 may end by bypassing step S56-2. When the threshold voltage of the selected memory cell MC is lower than the first reference voltage VR1 and the third reference voltage VR3, the threshold voltage of the selected memory cell MC may have a voltage level between the set distribution minimum voltage VSmin and the third reference voltage VR3. Since the resistance status of the selected memory cell MC having the threshold voltage lower than the third reference voltage VR3 has a sufficient margin to be discriminated from the high resistance status, there may be no need to re-write the set data into the selected memory cell MC. When the set data is not written into the selected memory cell MC having the threshold voltage lower than the third reference voltage VR3, power consumption for a write operation may be reduced. When the second detection signal SOUT2 has a logic low level, the write signal generator 410 might not enable the set write pulse signal SETP and the write circuit 122 might not write the set data into the selected memory cell MC.

Figure 6:
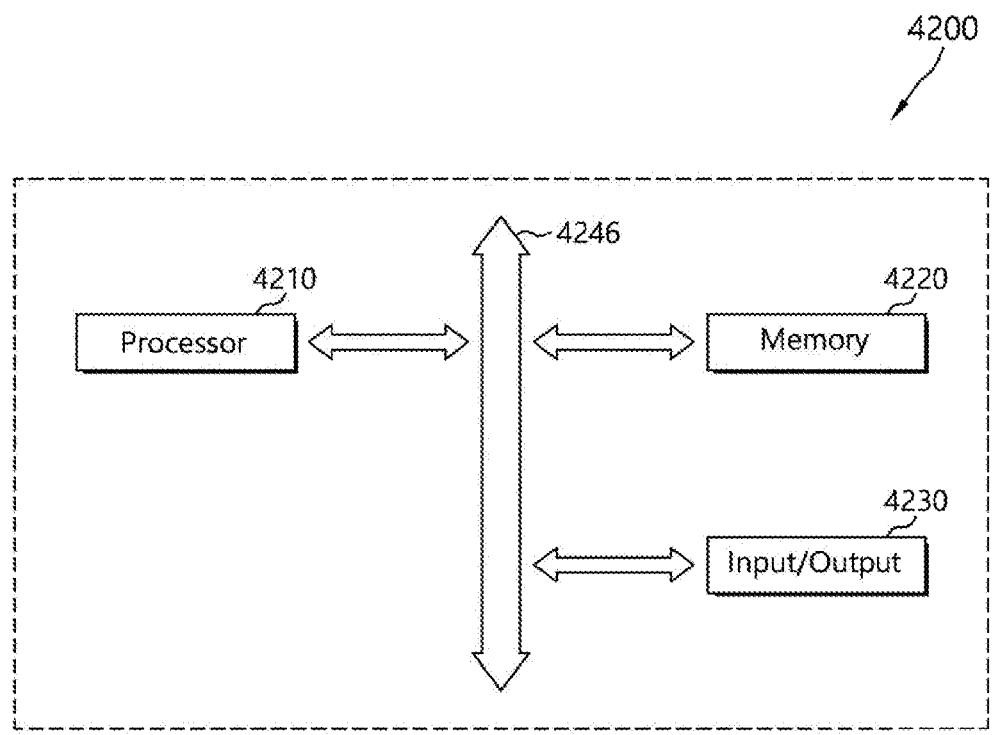
FIG. 6 illustrates a block diagram to assist in the explanation of an electronic apparatus including a semiconductor memory apparatus in accordance with an embodiment.

FIG. 6 illustrates a block diagram to assist in the explanation of an electronic apparatus including the semiconductor memory apparatuses in accordance with some embodiments. Referring to FIG. 6, the electronic apparatus 4200 may include a processor 4210, a memory 4220, and an input and output device 4230. The processor 4210, the memory 4220, and the input and output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include the semiconductor memory apparatuses 100 associated with FIG. 1. In order for realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Figure 7:
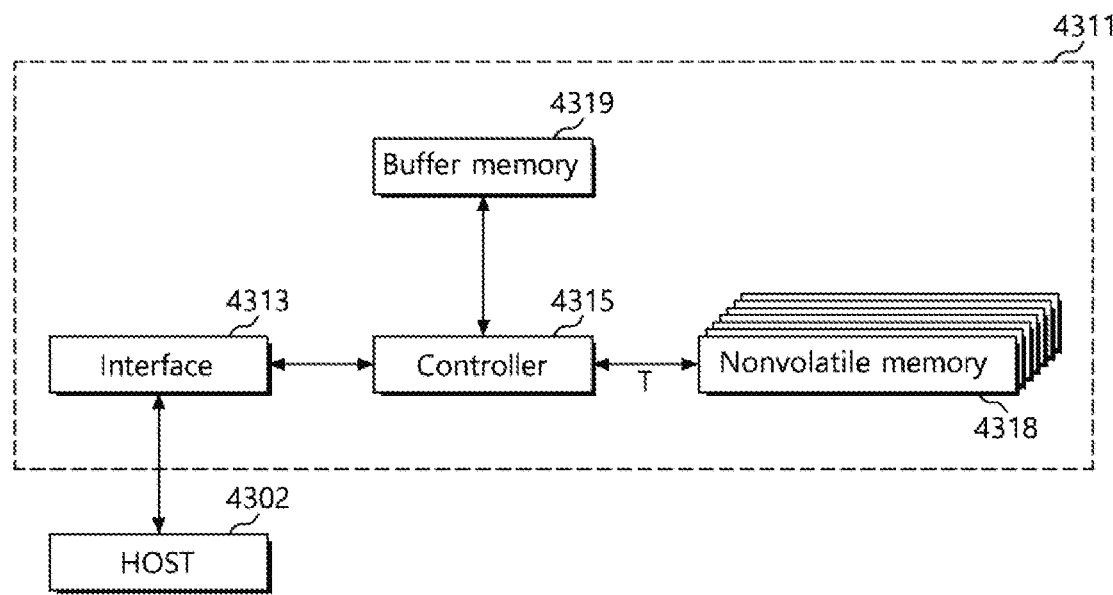
FIG. 7 illustrates a data storage device including a semiconductor memory apparatus in accordance with an embodiment.

FIG. 7 illustrates a data storage device including the semiconductor memory apparatuses in accordance with some embodiments. Referring to FIG. 7, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that speed is high, additionally, a mechanical delay, a failure rate, heat generation, and noise generation decrease, and miniaturization, and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T. The data storage capacity of the solid state disk 4311 may correspond to the nonvolatile memories 4318. The buffer memory 4319 may be formed adjacent to the controller 4315, and be electrically coupled to the controller 4315. Each of the nonvolatile memories 4220 may include the semiconductor memory apparatuses 100 associated with FIG. 1.

The interface 4313 may be coupled to a host 4302, and play the role of transmitting and receiving electrical signals such as data. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may play the role of storing the data received through the interface 4313. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the semiconductor memory apparatuses 100 associated with FIG. 1.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

While certain embodiments have been described above, it will be understood to those skilled in the art that the embodiments described are by way of example only. Accordingly, the nonvolatile memory apparatus, write method thereof, and system using the same should not be limited based on the described embodiments. Rather, the nonvolatile memory apparatus, write method thereof, and system using the same described herein should only be limited in light of the claims that follow when taken in conjunction with the above description and accompanying drawings.

What is claimed is:

1. An operating method of a nonvolatile memory apparatus, the operating method comprising:
   firstly determining a threshold voltage of a memory cell by using a first read voltage;
   secondly determining the threshold voltage of the memory cell by using a second read voltage having a different voltage level from the first read voltage based on write data and a result of the firstly determining; and
   writing the write data into the memory cell based on the result of the firstly determining and a result of the secondly determining,
   wherein the second read voltage has a higher voltage level than the first read voltage when the write data is reset data, and the second read voltage has a lower voltage level than the first read voltage when the write data is set data.

2. The operating method of claim 1, wherein the first read voltage has a voltage level between a drift set distribution maximum voltage and a drift reset distribution minimum voltage of the memory cell.

3. The operating method of claim 1, wherein the second read voltage has a voltage level lower than a drift reset distribution maximum voltage and higher than a middle voltage of a drift reset distribution when the write data is reset data.

4. The operating method of claim 1, wherein the second read voltage has a voltage level lower than a drift set distribution maximum voltage and higher than a middle voltage of a drift set distribution when the write data is set data.

5. A nonvolatile memory apparatus comprising:
a memory cell array including a plurality of memory cells;
a read circuit configured to detect, based on a read pulse signal and a read voltage, a threshold voltage of a selected memory cell among the plurality of memory cells;
a write circuit configured to perform, based on a reset write pulse signal a set write pulse signal, a write operation on the selected memory cell;
a read control circuit configured to generate the read pulse signal based on a write signal and a read control signal and configured to provide, as the read voltage, one among a first reference voltage, a second reference voltage, and a third reference voltage based on the read pulse signal and the write data; and
a write control circuit configured to generate the read control signal, the reset write pulse signal, and the set write pulse signal based on the threshold voltage of the selected memory cell, the write signal, and the write data.

6. The nonvolatile memory apparatus of claim 5, wherein the second reference voltage has a higher voltage level than the first reference voltage and the third reference voltage has a lower voltage level than the first reference voltage.

7. The nonvolatile memory apparatus of claim 6, wherein the first reference voltage has a voltage level between a drift set distribution maximum voltage and a drift reset distribution minimum voltage.

8. The nonvolatile memory apparatus of claim 6, wherein the second reference voltage has a voltage level lower than a drift reset distribution maximum voltage and higher than a middle voltage of a drift reset distribution.

9. The nonvolatile memory apparatus of claim 6, wherein the third reference voltage has a voltage level lower than a drift set distribution maximum voltage and higher than a middle voltage of a drift set distribution.

10. The nonvolatile memory apparatus of claim 5, wherein the read control circuit is configured to enable a first read pulse signal based on the write signal and configured to provide the first reference voltage as the read voltage.

11. The nonvolatile memory apparatus of claim 10, wherein the read control circuit is configured to enable a second read pulse signal based on the read control signal and configured to provide, as the read voltage, one of either the second reference voltage or the third reference voltage based on the write data.

12. The nonvolatile memory apparatus of claim 5, wherein the read control circuit includes:
a read pulse generator configured to generate a first read pulse signal and a second read pulse signal based on the write data and the read control signal; and
a read voltage selector configured to output, as the read voltage, the first reference voltage when the first read pulse signal is enabled and configured to output, as the read voltage, one of either the second reference voltage or the third reference voltage based on the write data when the second read pulse signal is enabled.

13. The nonvolatile memory apparatus of claim 5, wherein the write control circuit is configured to enable the reset write pulse signal when the write data is reset data and the threshold voltage of the selected memory cell is lower than the first reference voltage.

14. The nonvolatile memory apparatus of claim 5, wherein the write control circuit is configured to enable the read control signal when the write data is reset data and the threshold voltage of the selected memory cell is higher than the first reference voltage.

15. The nonvolatile memory apparatus of claim 14, wherein the write control circuit is configured to enable the reset write pulse signal when the threshold voltage of the selected memory cell is higher than the second reference voltage.

16. The nonvolatile memory apparatus of claim 14, wherein the write control circuit is configured not to write the reset data into the selected memory cell when the threshold voltage of the selected memory cell is lower than the second reference voltage.

17. The nonvolatile memory apparatus of claim 5, wherein the write control circuit is configured to enable the set write pulse signal when the write data is set data and the threshold voltage of the selected memory cell is higher than the first reference voltage.

18. The nonvolatile memory apparatus of claim 17, wherein the write control circuit is configured to enable the read control signal when the write data is set data and the threshold voltage of the selected memory cell is lower than the first reference voltage.

19. The nonvolatile memory apparatus of claim 18, wherein the write control circuit is configured to enable the set write pulse signal when the threshold voltage of the selected memory cell is higher than the third reference voltage.

20. The nonvolatile memory apparatus of claim 18, wherein the write control circuit is configured not to write the set data into the selected memory cell when the threshold voltage of the selected memory cell is lower than the third reference voltage.

21. A nonvolatile memory apparatus comprising:
a memory cell array including a plurality of memory cells;
a read circuit configured to detect a threshold voltage of a selected memory cell among the plurality of memory cells based on one of a first reference voltage, a second reference voltage, and a third reference voltage;
a write circuit configured to write one of a reset data and a set data on the selected memory cell;
a write operation control circuit configured to control the read circuit to firstly determine the threshold voltage of the selected memory cell using the first reference voltage, to control the read circuit to secondly determine the threshold voltage of the selected memory cell using one of the second and third reference voltages based on a write data and a firstly determining result, and to control the write circuit to write the write data into the selected memory cell based on the firstly determining result and a secondly determining result.

22. The non-volatile memory apparatus of claim 21, wherein the write operation control circuit controls the read circuit to secondly determine the threshold voltage of the selected memory cell using the second reference voltage when the write data is the reset data, and controls the read circuit to secondly determine the threshold voltage of the selected memory cell using the third reference voltage.

* * * * *

UNITED STATES PATENT AND TRADEMARK OFFICE
CERTIFICATE OF CORRECTION

PATENT NO. : 10,964,376 B2  
APPLICATION NO. : 16/698578  
DATED : March 30, 2021  
INVENTOR(S) : Ho Seok Em Page 1 of 1

It is certified that error appears in the above-identified patent and that said Letters Patent is hereby corrected as shown below:

On the Title Page

Item (73) Assignee:
Replace "SK hynix Inc., Incheon-si (KR)" with --SK hynix Inc., Icheon-si, Gyeonggi-do (KR)--

Signed and Sealed this  
Thirtieth Day of November, 2021

Drew Hirshfeld  
*Performing the Functions and Duties of the*  
*Under Secretary of Commerce for Intellectual Property and*  
*Director of the United States Patent and Trademark Office*